United States Patent
Schaffer et al.

(10) Patent No.: US 7,355,431 B2
(45) Date of Patent: Apr. 8, 2008

(54) TEST ARRANGEMENT INCLUDING ANISOTROPIC CONDUCTIVE FILM FOR TESTING POWER MODULE

(75) Inventors: Christopher P Schaffer, Long Beach, CA (US); Johan Strydom, El Segundo, CA (US); Andrea Ciuffoli, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/141,860

(22) Filed: Jun. 1, 2005

(65) Prior Publication Data

US 2005/0270057 A1    Dec. 8, 2005

Related U.S. Application Data

(60) Provisional application No. 60/576,727, filed on Jun. 3, 2004.

(51) Int. Cl.
*G01R 31/26* (2006.01)
(52) U.S. Cl. .................................... 324/765; 324/755
(58) Field of Classification Search ........ 324/754–762; 439/61–71, 55
See application file for complete search history.

(56) References Cited

U.S. PATENT DOCUMENTS

| | | | |
|---|---|---|---|
| 6,204,681 B1* | 3/2001 | Nagatsuka et al. | 324/761 |
| 6,320,747 B1* | 11/2001 | Jahn et al. | 361/704 |
| 6,483,331 B2* | 11/2002 | Tamaru et al. | 324/754 |
| 6,799,976 B1* | 10/2004 | Mok et al. | 439/55 |

OTHER PUBLICATIONS

"iP2003A, Synchronous Buck Multiplase Optimized LGA Power Block", PD-96987A,, pp. 1-10, Internaltiona IR Rectifier ,WWW.IRF.com.*

"iP2003A, Synchronous Buck Multiplase Optimized LGA Power Block", PD-96987A,, pp. 1-10, Internaltiona IR Rectifier ,WWW.IRF.com (Oct. 19, 2005).*

* cited by examiner

*Primary Examiner*—Vinh P. Nguyen
(74) *Attorney, Agent, or Firm*—Ostrolenk, Faber, Gerb & Soffen, LLP

(57) ABSTRACT

A testing apparatus and method for testing a semiconductor device, and more particularly a test arrangement for measuring a guaranteed power loss of a semiconductor module, not requiring the module to have on-board decoupling capacitors for the power loss test. The conventional pogo-pin array and test socket are replaced by a novel low cost anisotropic conductive elastomer and a low cost socket, the conductive polymer providing electrical communication between the socket and the module under test.

4 Claims, 5 Drawing Sheets

TEST ARRANGEMENT INCLUDING ANISOTROPIC CONDUCTIVE FILM FOR TESTING POWER MODULE

CROSS-REFERENCE TO RELATED APPLICATION

The present application is based upon and claims priority of provisional application No. 60/576,727, filed Jun. 3, 2004, incorporated by reference.

BACKGROUND OF THE INVENTION

1. Field of the Invention

This invention relates to a testing apparatus and method for testing a semiconductor device, and more particularly to a test setup for measuring a guaranteed power loss of a semiconductor module, in which the module is not required to have on-board capacitors for the power loss test.

2. Background Art

Currently, to perform power loss testing on a semiconductor module, two large capacitors must be included in the package. These have no value to the user and are only used for power loss testing. Integrated power supply manufacturers cannot guarantee a power loss on their data sheets unless they use complex test processes and on-board capacitors. FIG. 3 shows a board to be tested in which internal input capacitors "X" are needed for a power loss test. In the power loss test circuit, power loss is calculated by the formula $P_{LOSS=(PIN}+P_{DD})-P_{OUT}$, wherein $P_{LOSS}$ is power loss, $P_{IN}$ is input power, $P_{DD}$ is supply power, and $P_{OUT}$ is output power. The module shown is the iP2003 iPOWIR™ module manufactured by the applicant, the International Rectifier Corp., described in document no. PD-96922 A dated Nov. 18, 2004, available at www.irf.com.

The conventional testing arrangement uses traditional "pogo-pins" and sockets. FIG. 1 shows a known test fixture with a "pogo-pin" contact array 30 arranged in a test socket 40 on a test board 50. FIG. 2 shows the pogo-pin structure in schematic sectional form. The pins are mounted in a relatively rigid frame 32. Each pin, for example the pin 34, has a pair of plungers 34a, 34b at its two ends, which are spring-loaded so as to retract a distance d.

The module being tested is placed from above on the test socket shown in FIG. 1, where the spring-loaded pogo pins make contact with electrodes on the module to apply power and make measurements of parameters on the module. Because the pins are fixed in location with respect to their frame and to the test socket, registration between the pins and the electrodes on the module must be very precise.

The known pogo pin arrangement can generate both stray inductance and interconnection resistance (contact resistance plus conductor resistance) which can cause oscillation and power loss at the power supply input and output, causing power loss measurements to be inaccurate. Also, if the pogo pins make poor or intermittent contact with the corresponding test points on the module, voltage transients can occur when power is applied. Such transients may waste testing time, since the test cannot be completed until the transients settle down, and they may even damage the semiconductor module.

For accurate power loss testing it is important to have a low impedance supply, comprising capacitors with little or no interconnection distance. Any increase in the separation between the supply and the module supply pins will increase stray inductance in the supply circuit. This stray inductance in turn will result in voltage oscillations (dynamic variations) on the supply pins of the module which will change the power loss and can even cause failure of the module, due to transient over-voltage conditions.

Furthermore, the power-loss measurement has to be accurate. The pogo-pins form a coarse grid with a limited number of pins making contact to each of the required pads, resulting in a high contact resistance. The pins themselves also have some resistance. This total interconnection resistance between the test socket and the module, although reasonably small, can be significant, especially at high-current power-loss testing. The voltage-drop across the interconnections also increases as the current flowing through them causes heating, thereby increasing the interconnection resistance further and changing the power-loss operating point (that is, more of the input power is dissipated within the interconnections, reducing the input power to the module).

The need to eliminate such factors, and particularly to compensate for stray inductance and realize the required low supply impedance inside and at the supply pins of the module, leads to the requirement of large on-board input and output decoupling capacitors which, as mentioned above, are of no value to the customer. They are useful only to the manufacturer, who must include the capacitors in order to test the module, for example to determine a guaranteed power loss figure.

SUMMARY OF THE INVENTION

According to a central aspect of the invention, the need for on-board capacitors to carry out a power loss test is eliminated by a novel low cost anisotropic conductive elastomer providing a low cost socket which replaces the socket and pogo-pin array of FIGS. 1 and 2. With this elastomer, stray inductance is reduced because the length of the interconnects is reduced and the number of parallel connections is increased. Further, contact and conductive resistance are reduced by providing more conductors, of shorter length, than in a pogo pin array. Finally, the elastomer provides reliable contact and less chance of voltage transients when the module to be tested is lowered onto the test board.

This invention thereby permits the manufacture and testing of integrated power supply modules (such as the applicant's iPOWIR™ modules) for the purpose of determining a guaranteed power loss figure, without requiring on-board capacitors.

According to aspects of the invention, a method and an apparatus for testing a semiconductor module having power terminals for input/output of electrical power, includes a test socket with power terminals arranged for applying power to the module power terminals, and an anisotropic conductive elastomeric sheet disposed on the test socket. The semiconductor module is disposed on the sheet, thereby providing electrical communication through the sheet between the respective power terminals of the test socket and the semiconductor module. The power is measured at the power terminals, thereby determining an electrical characteristic of the module.

The method and apparatus are especially useful in measuring power loss of the module without requiring the large decoupling capacitors required in prior art arrangements. With the invention, the internal semiconductor circuits can be connected directly to the module power terminals without interposed decoupling capacitors.

According to another aspect of the invention, the module also has signal terminals in addition to the power terminals; and signal measuring terminals are provided on the test socket, and used to measure signals from the signal terminals of the module. The anisotropic conductive elastomeric sheet provides signal communication between the signal measurement terminals and the signal terminals.

With these features, the size (height) of the sheet interconnections is significantly less than that of the known pogo-pins and allows for an interconnection with little stray inductance. The improved voltage stability within the module due to this reduced impedance connection allows the large decoupling capacitors to be removed from the module.

Further, the fine grid of conductors in the film sheet increases the number of contact points to each pad on the module. The short length of these conductors minimizes their resistance. Thus the total interconnection resistance (contact resistance and conductor resistance) is reduced. During high-current power-loss testing, the conductors in the sheet will dissipate far less power. This power dissipation is not enough to cause any significant change in the total interconnection resistance, resulting in a stable power-loss operating point.

Other features and advantages of the present invention will become apparent from the following description of embodiments of invention which refers to the accompanying drawings.

DETAILED DESCRIPTION OF EMBODIMENTS OF THE INVENTION

Figure 1:
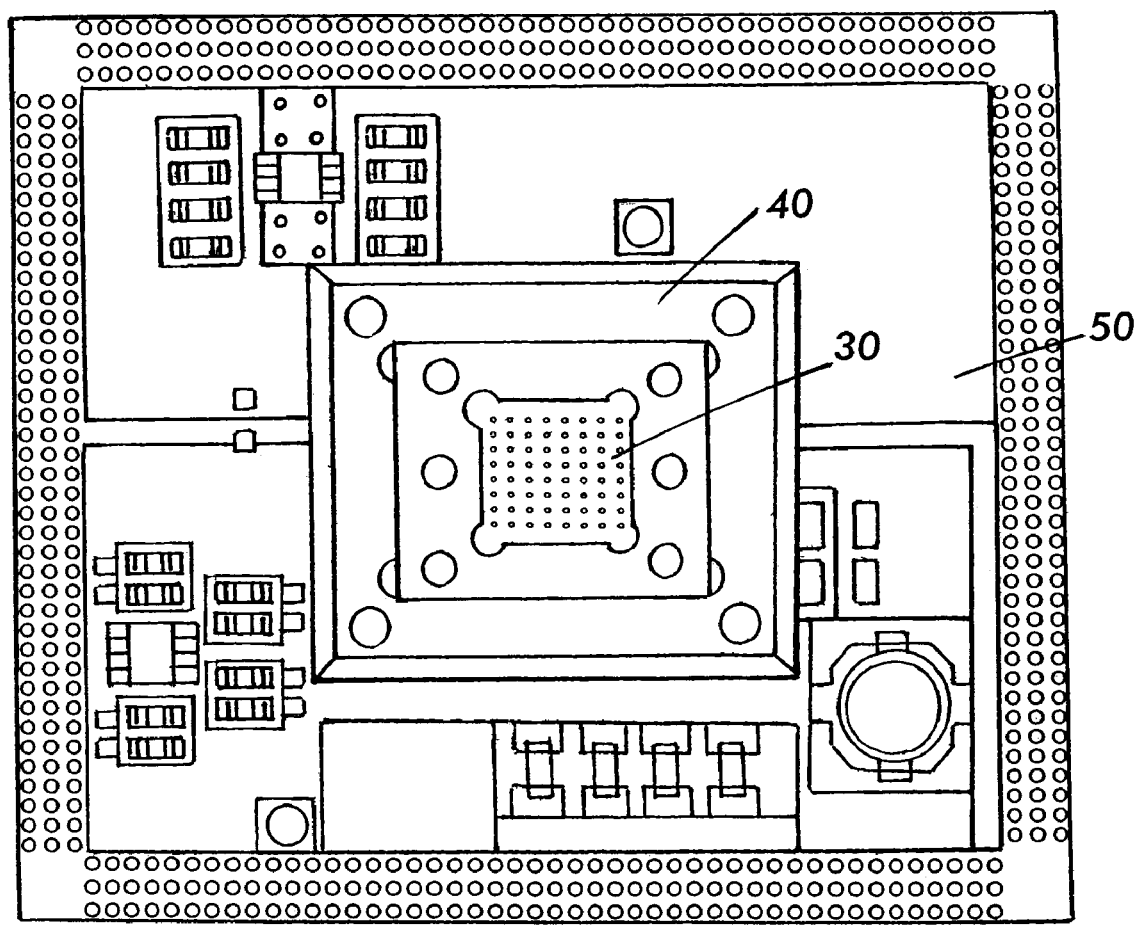
FIG. 1 shows a known test fixture with a "pogo-pin" contact and test socket arrangement.
Figure 2:
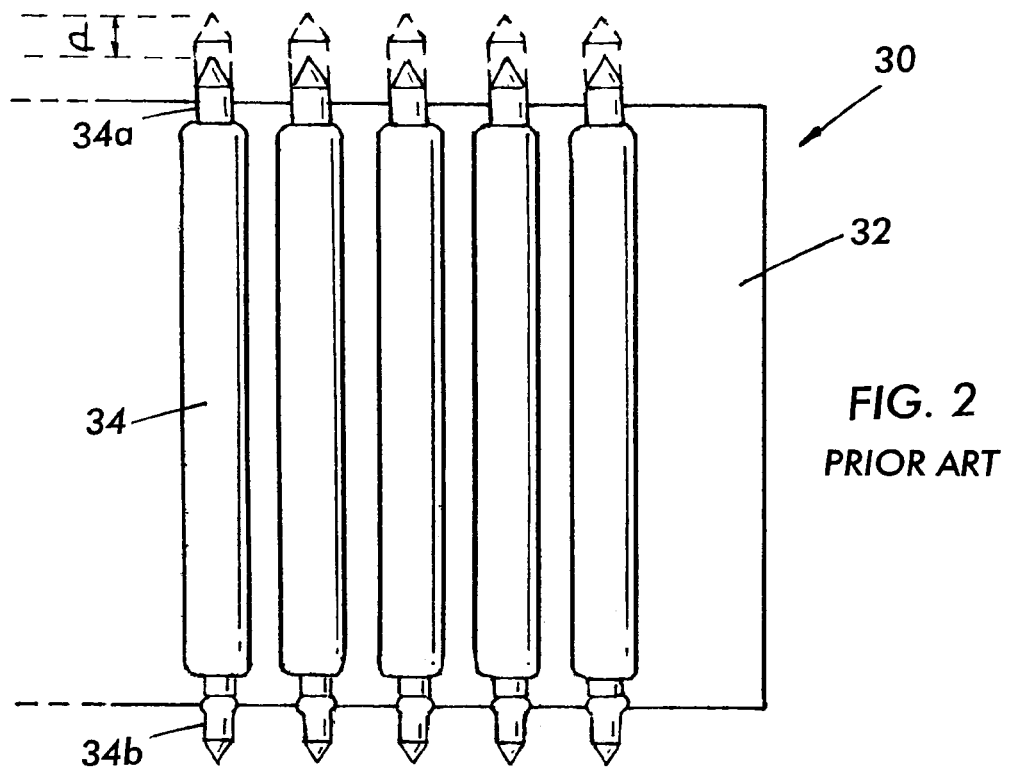
FIG. 2 shows the pogo-pin structure in schematic sectional form.
Figure 5:
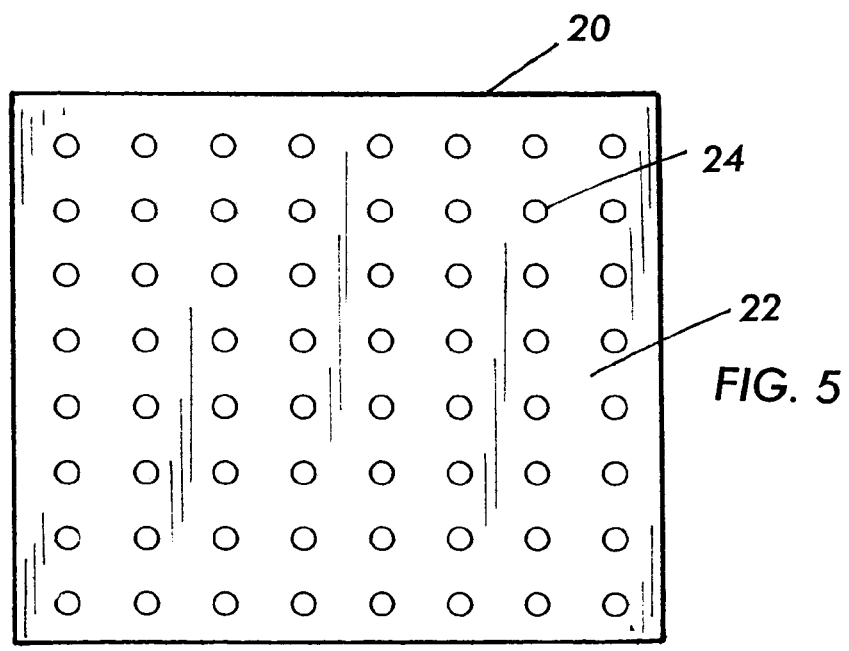
FIG. 5 shows in plan view one example of an anisotropic conductive sheet which replaces the known pogo-pin array.
Figure 4:
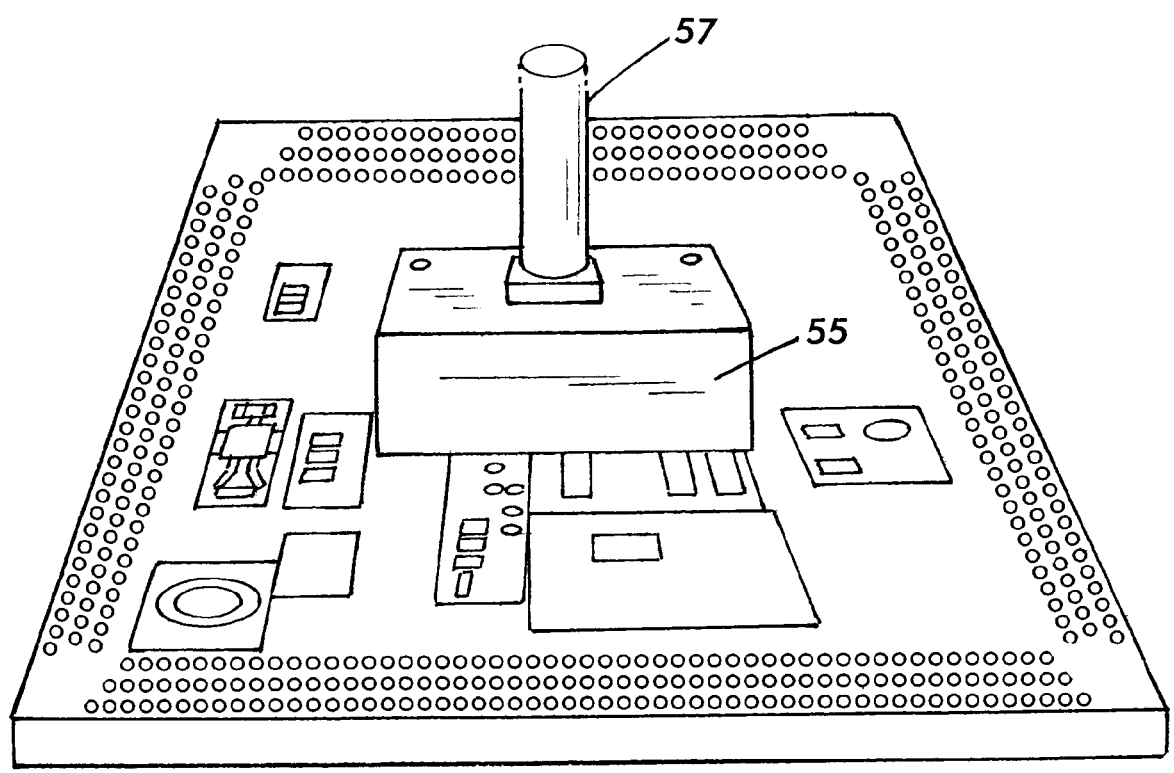
FIG. 4 is a perspective view of the test structure according to an embodiment of the invention.
Figure 6:
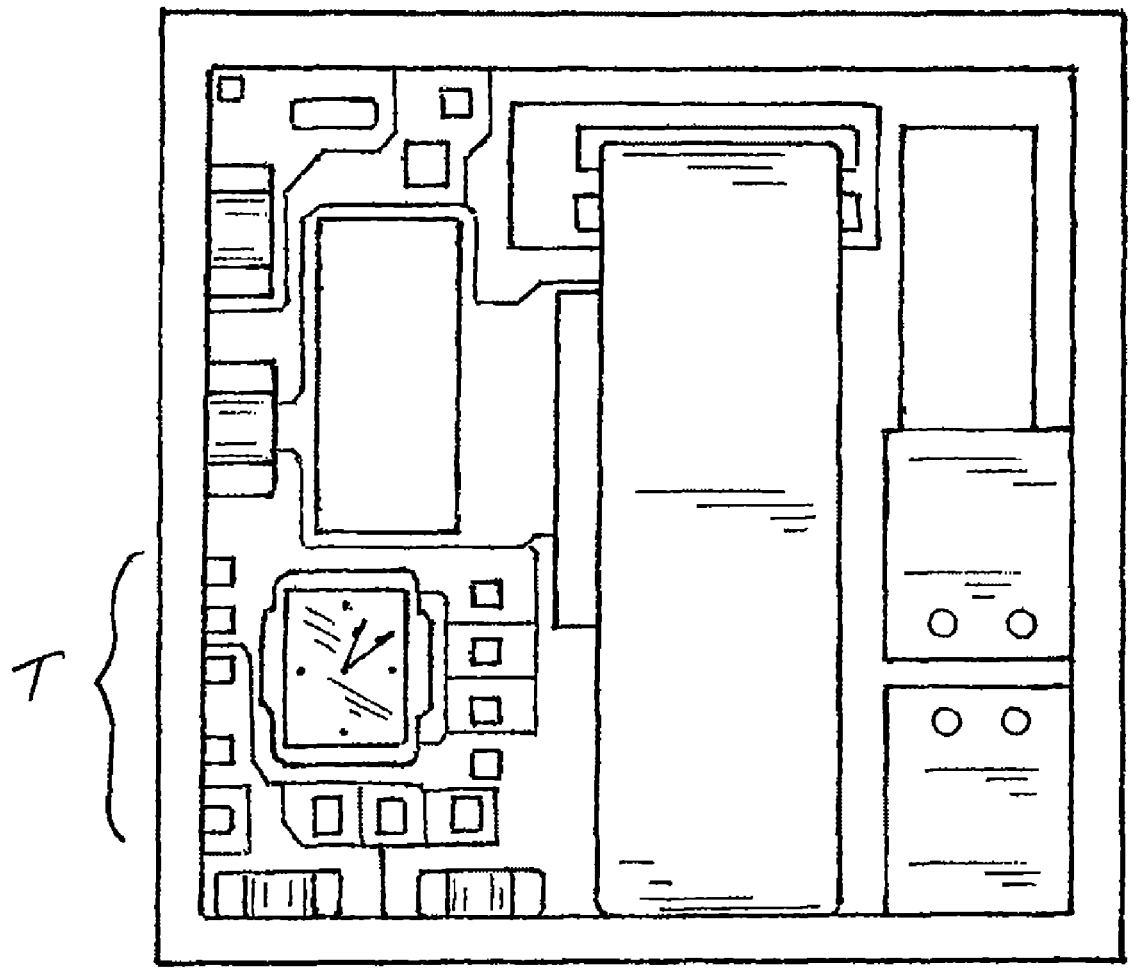
FIG. 6 schematically shows a board to be tested, having no on-board input and output decoupling capacitors.

As seen in FIG. 4, the module under test (shown schematically in FIG. 6) is held in a holding block 55 which is lowered onto the test board by a vertical shaft 57. Disposed in the test socket is an anisotropic conductive elastomeric sheet 20, shown in plan view in FIG. 5, i.e., an elastomeric sheet that conducts substantially in only one direction. Also shown schematically in FIG. 6 are terminals T which include both power terminals and signal terminals.

Figure 5A:
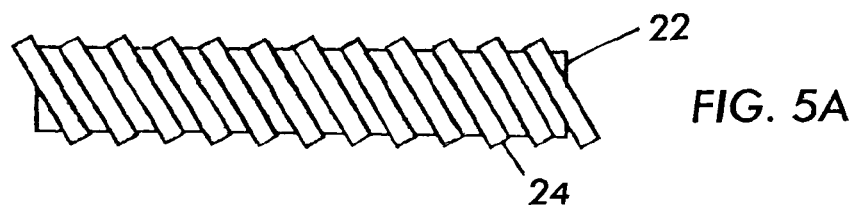
FIG. 5A is a schematic cross-sectional view of the anisotropic conductive sheet example shown in FIG. 5.
Figure 3:
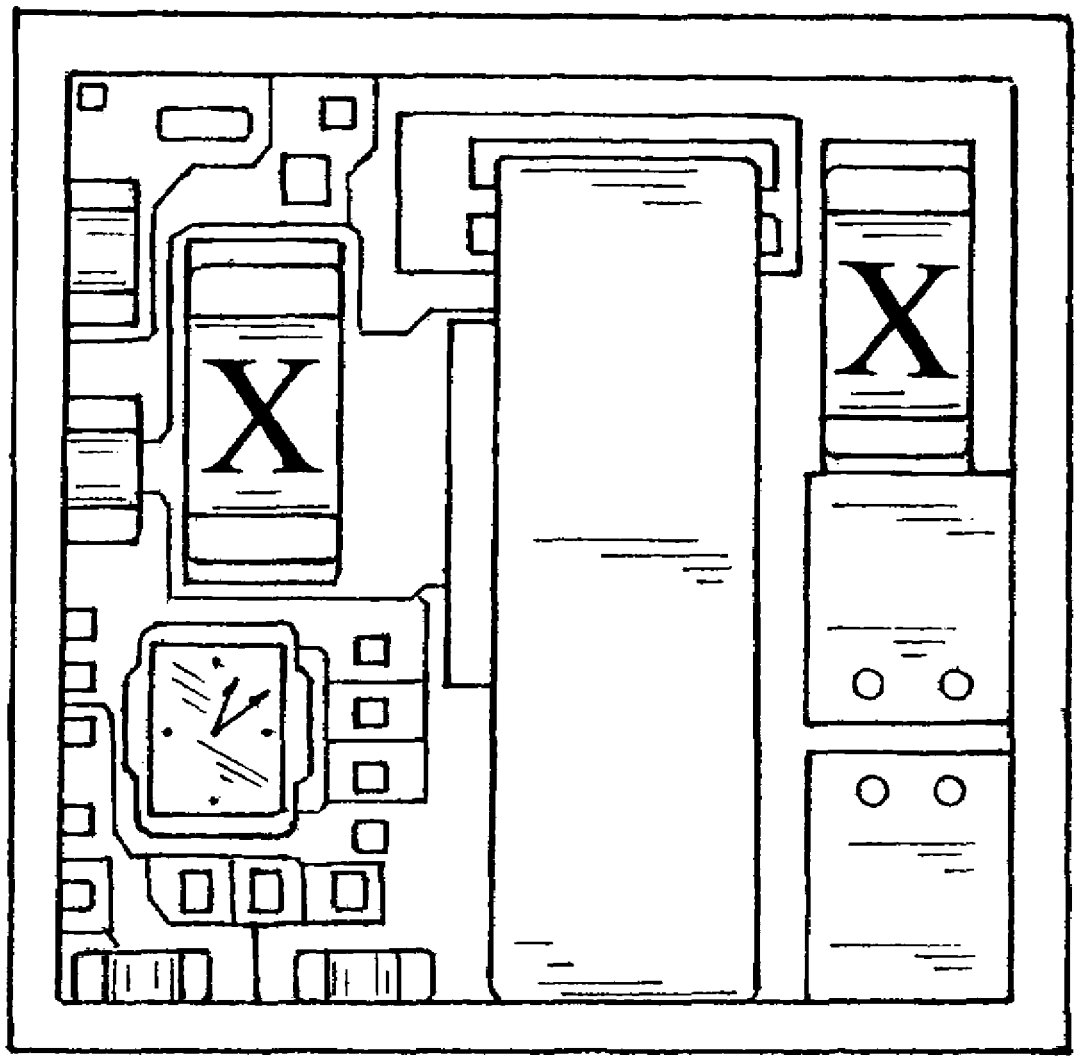
FIG. 3 shows a known board to be tested, which requires internal input capacitors "X" for a power loss test.

One example of such a sheet is shown in FIG. 5A. In this example, the sheet 20 comprises an elastomeric matrix 22, and a large number of conductors 24 extending substantially in parallel through the matrix 22. As seen, because of the flexibility of the matrix, the matrix can compress to an extent when the module is pressed down by the holding block, which may cause the conductors to tilt while still remaining parallel, providing more reliable communication between the test board and the module under test, than with the prior pogo-pin arrays.

The sheet may take other structures besides that shown in FIG. 5A, as long as it provides conductivity in one direction through the sheet.

Thus the use of the test arrangement including the anisotropic conductive film allows the removal of the internal module capacitors as it is now possible to accurately measure the module power-loss without the need for internal capacitors.

The shape, size and layout of the test arrangement now closely approximates the final customer application, which was impossible with the pogo-pin arrangement. The new test arrangement provides the same low impedance, low resistance interconnection that exists when the module is finally soldered onto the application board.

Although the present invention has been described in relation to particular embodiments thereof, many other variations and modifications and other uses will become apparent to those skilled in the art. The invention, therefore, is not limited by the specific disclosure herein.

What is claimed is:

1. A method of testing a semiconductor module having power terminals for input/output of electrical power, comprising the steps of:

providing a test socket with power terminals arranged for applying power to said power terminals of said module;

disposing an anisotropic conductive elastomeric sheet on said test socket;

disposing said semiconductor module on said sheet, thereby providing electrical communication through said sheet between the respective power terminals of said test socket and said semiconductor module;

wherein the module comprises a circuit which is connected directly to said module power terminals without an interposed decoupling capacitor; and measuring said power at said power terminals, so as to determine an electrical characteristic of said module;

wherein said electrical characteristic is power loss.

2. The method of claim 1, wherein said module further has signal terminals in addition to said power terminals; and further comprising the steps of:

providing signal measurement terminals on said test socket; and using said signal measurement terminals to measure signals from said signal terminals of said module, said sheet providing signal communication between said signal measurement terminals and said signal terminals.

3. A test apparatus for testing a semiconductor module having power terminals for input/output of electrical power, comprising in combination:

a test socket with power terminals arranged for applying power to said power terminals of said module; and an anisotropic conductive elastomeric sheet disposed on said test socket;

further comprising a semiconductor module disposed on said sheet, such that said sheet provides electrical communication between the respective power terminals of said test socket and said semiconductor module;

wherein the module comprises a circuit which is connected directly to said module power terminals without an interposed decoupling capacitor; and further comprising a measuring device for measuring said power at said power terminals, and thereby determining an electrical characteristic of said module;

wherein said electrical characteristic is power loss.

4. The combination of claim 3, wherein said module further has signal terminals in addition to said power terminals; and further comprising:

signal measurement terminals on said test socket;

said signal measurement terminals being operable to measure signals from said signal terminals of said module, via signal communication through said sheet.

* * * * *